United States Patent
Kwon

(10) Patent No.: US 9,818,942 B2
(45) Date of Patent: Nov. 14, 2017

(54) METHOD OF MANUFACTURING ORGANIC LIGHT-EMITTING DISPLAY APPARATUS

(71) Applicant: Samsung Display Co., Ltd., Yongin-si (KR)

(72) Inventor: Younggil Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/187,248

(22) Filed: Jun. 20, 2016

(65) Prior Publication Data
US 2017/0062721 A1    Mar. 2, 2017

(30) Foreign Application Priority Data
Aug. 25, 2015   (KR) ........................ 10-2015-0119825

(51) Int. Cl.
| | |
|---|---|
| H01L 51/00 | (2006.01) |
| H01L 51/50 | (2006.01) |
| H01L 51/52 | (2006.01) |
| H01L 27/32 | (2006.01) |
| H01L 51/56 | (2006.01) |

(52) U.S. Cl.
CPC ...... *H01L 51/0016* (2013.01); *H01L 27/3246* (2013.01); *H01L 51/50* (2013.01); *H01L 2227/323* (2013.01)

(58) Field of Classification Search
CPC ........................................................ H01L 51/50
See application file for complete search history.

(56) References Cited

U.S. PATENT DOCUMENTS

| | | | |
|---|---|---|---|
| 9,159,925 B2 | 10/2015 | Defranco | |
| 2011/0159252 A1 | 6/2011 | Ober et al. | |
| 2013/0075768 A1* | 3/2013 | Kim | H01L 51/0016 257/88 |
| 2013/0210176 A1* | 8/2013 | Fushimi | H01L 51/5256 438/26 |
| 2013/0236999 A1 | 9/2013 | Lee et al. | |
| 2014/0127625 A1 | 5/2014 | Defranco et al. | |

(Continued)

FOREIGN PATENT DOCUMENTS

| | | |
|---|---|---|
| KR | 10-2010-0102353 | 9/2010 |
| KR | 10-2011-0009708 | 1/2011 |

(Continued)

*Primary Examiner* — Caleb Henry
*Assistant Examiner* — Mounir Amer
(74) *Attorney, Agent, or Firm* — H.C. Park & Associates, PLC

(57) ABSTRACT

A method of manufacturing an organic light-emitting display apparatus includes forming an anode on a substrate, forming a lift-off layer on the substrate including the anode, the lift-off layer including a fluoropolymer, forming a polymer layer on the lift-off layer, forming a pattern on a first portion of the polymer layer overlapping the anode using a roll-to-roll stamp process, etching a first portion of the lift-off layer corresponding to the pattern using a first solvent including fluorine, the first portion of the lift-off layer being disposed on the anode, forming an organic functional layer including a light-emitting layer on the anode and a second portion of the polymer layer not formed with the pattern, removing the lift-off layer using a second solvent including fluorine, and forming a cathode on the organic functional layer.

16 Claims, 36 Drawing Sheets

(56) References Cited

U.S. PATENT DOCUMENTS

2014/0252679 A1 9/2014 Hwang et al.
2017/0025610 A1* 1/2017 Kwon ................ H01L 51/0007

FOREIGN PATENT DOCUMENTS

| KR | 10-2011-0122441 | 11/2011 |
| KR | 10-2014-0109624 | 9/2014 |
| WO | 2013-074617 | 5/2013 |

* cited by examiner

METHOD OF MANUFACTURING ORGANIC LIGHT-EMITTING DISPLAY APPARATUS

CROSS-REFERENCE TO RELATED APPLICATION

This application claims priority from and the benefit of Korean Patent Application No. 10-2015-0119825, filed on Aug. 25, 2015, which is hereby incorporated by reference for all purposes as if fully set forth herein.

BACKGROUND

Field

Exemplary embodiments relate to a method of manufacturing an organic light-emitting display apparatus.

Discussion of the Background

Organic light-emitting display apparatuses may be self-luminous display apparatuses having a hole injection electrode, an electron injection electrode, and an organic light-emitting layer between the hole injection electrode and the electron injection electrode. As holes injected by the hole injection electrode and electrons injected by the electron injection electrode are combined and become neutral in the organic light-emitting layer, light is emitted. An organic light-emitting display apparatus has been highlighted as a next generation display apparatus having high quality characteristics, for example, low power consumption, high brightness, and fast response speed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing an organic light-emitting display apparatus which may reduce manufacturing costs thereof.

Additional aspects will be set forth in the detailed description which follows, and, in part, will be apparent from the disclosure, or may be learned by practice of the inventive concept.

According to an exemplary embodiment of the present invention, a method of manufacturing an organic light-emitting display apparatus includes forming an anode on a substrate, forming a lift-off layer on the substrate including the anode, the lift-off layer including a fluoropolymer, forming a polymer layer on the lift-off layer, forming a pattern on a first portion of the polymer layer overlapping the anode using a roll-to-roll stamp process, etching a first portion of the lift-off layer corresponding to the pattern using a first solvent including fluorine, the first portion of the lift-off layer being disposed on the anode, forming an organic functional layer including a light-emitting layer on the anode and a second portion of the polymer layer not formed with the pattern, removing the lift-off layer using a second solvent including fluorine, and forming a cathode on the organic functional layer.

According to an exemplary embodiment of the present invention, a method of manufacturing an organic light-emitting display apparatus includes forming an anode on a substrate, forming a lift-off layer on the substrate including the anode, the lift-off layer including a fluoropolymer, forming a pattern on a first portion the lift-off layer overlapping the anode using a roll-to-roll stamp process, forming an organic functional layer including a light-emitting layer on the anode and on a second portion of the lift-off layer not formed with the pattern, removing the lift-off layer using a solvent including fluorine, and forming a cathode on the organic functional layer.

According to an exemplary embodiment of the present invention, a method of manufacturing an organic light-emitting display apparatus includes forming a first anode and a second anode spaced apart from each other on a substrate, performing a unit process on each of the first and second anodes, and forming a cathode after performing the unit process for each of the first and second anodes. The unit process includes forming a lift-off layer on the substrate, the lift-off layer including a fluoropolymer, forming a polymer layer on the lift-off layer, forming a pattern on a first portion of the polymer layer overlapping a corresponding anode using a roll-to-roll stamp process, etching a first portion of the lift-off layer corresponding to the pattern using a first solvent including fluorine, forming an organic functional layer including a light-emitting layer on the corresponding anode and on a second portion of the polymer layer not formed with the pattern, and removing the lift-off layer using a second solvent including fluorine. A first organic light emitting layer disposed on the first anode and a second organic light emitting layer disposed on the second anode are configured to emit different colored light.

According to an exemplary embodiment of the present invention, a method of manufacturing an organic light-emitting display apparatus includes forming a first anode and a second anode spaced apart from each other on a substrate, performing a unit process on each of the first and second anodes, and forming a cathode after performing the unit process for each of the first and second anodes. The unit process includes forming a lift-off layer including a fluoropolymer on the substrate, forming a pattern on a first portion of the lift-off layer overlapping a corresponding anode using a roll-to-roll stamp process, forming an organic functional layer including a light-emitting layer on the corresponding anode and a second portion of the lift-off layer not formed with the pattern, and removing the lift-off layer using a solvent including fluorine. A first organic light emitting layer disposed on the first anode and a second organic light emitting layer disposed on the second anode are configured to emit different colored light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
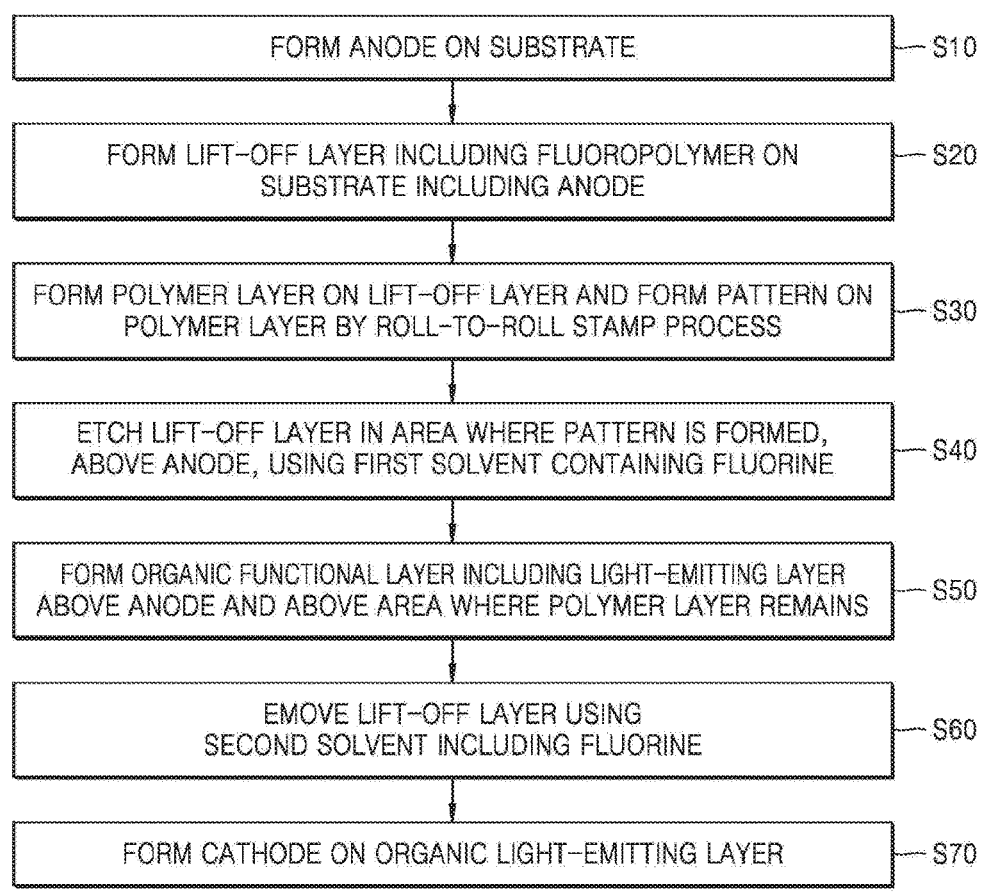
FIG. 1 is a flowchart of a manufacturing method of an organic light-emitting display apparatus according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of is one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a flowchart of a manufacturing method of an organic light-emitting display apparatus according to an exemplary embodiment of the present invention.

Referring to FIG. 1, in the method of manufacturing an organic light-emitting display apparatus 1 according to the present exemplary embodiment, an anode is formed on a substrate, per step S10. In step S20, a lift-off layer including fluoropolymer is formed on the substrate including the anode. In step S30, a polymer layer is formed on the lift-off layer and a pattern is formed on the polymer layer by a roll-to-roll stamp process.

In step S40, a portion of the lift-off layer, on which the pattern is formed, above the anode, is etched using a first solvent including fluorine. In step S50, an organic functional layer including a light-emitting layer is formed above the anode and above the area where the polymer layer remains. In step S60, the lift-off layer is removed by using a second solvent including fluorine. In step S70, a cathode is formed on the organic light-emitting layer.

The manufacturing method according to an exemplary embodiment of the present invention will be described in detail with reference to FIGS. 2 to 6.

Figure 2:
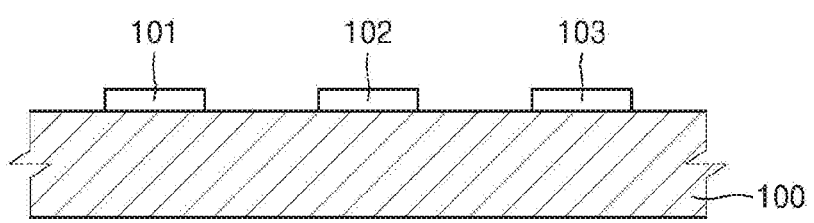
FIG. 2 is a cross-sectional view schematically illustrating anodes formed on a substrate, according to an exemplary embodiment of the present invention.

FIG. 2 is a cross-sectional view schematically illustrating anodes formed on a substrate according to an exemplary embodiment of the present invention. FIGS. 3A to 3F are cross-sectional views schematically illustrating a first unit operation of the manufacturing method of FIG. 1. FIGS. 4A to 4F are cross-sectional views schematically illustrating a second unit operation of the manufacturing method of FIG. 1. FIGS. 5A to 5F are cross-sectional views schematically illustrating a third unit operation of the manufacturing method of FIG. 1. FIG. 6 is a schematic cross-sectional view of an organic light-emitting display apparatus 1 manufactured by the manufacturing method of FIG. 1.

Referring to FIG. 2, anodes including a first anode 101, a second anode 102, and a third anode 103 are formed on a substrate 100.

The substrate 100 may be formed of a flexible material including glass or plastic. For example, the plastic may be formed of a material having excellent thermal resistance and durability characteristics, such as polyimide, polyethylenenaphthalate, polyethyleneterephthalate, polyarylate, polycarbonate, polyetherlmide, or polyethersulfone.

Although not illustrated in FIG. 2, a planar surface may be formed above the substrate 100 and a buffer layer (not shown) may be further formed on the planar surface to prevent intrusion of impurities. The buffer layer may include silicon nitride and/or silicon oxide in a single layer or a multiple layer.

The first, second, and third anodes 101, 102, and 103, as hole injection electrodes, may include a material having relatively large work function. The first to third anodes 101, 102, and 103 may include at least one of indium tin oxide, indium zinc oxide, zinc oxide, indium oxide, indium gallium oxide, and aluminum zinc oxide.

Although not illustrated in FIG. 2, the first, second, and third anodes 101, 102, and 103 may be electrically connected to first, second, and third thin-film transistors (not shown), respectively, located between the substrate 100 and the first to third anodes 101, 102, and 103.

Figure 3A:
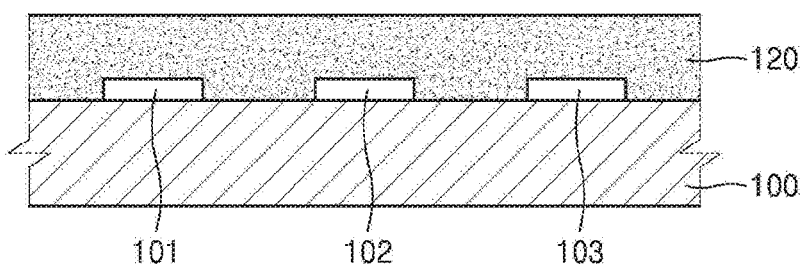
FIG. 3A, FIG. 3B, FIG. 3C, FIG. 3D, FIG. 3E, and FIG. 3F are cross-sectional views schematically illustrating a first unit operation of the manufacturing method of FIG. 1.

Referring to FIG. 3A, a lift-off layer 120 including fluoropolymer is formed on the substrate 100, on which the first to third anodes 101, 102, and 103 are formed.

The fluoropolymer included in the lift-off layer 120 may be a polymer having a fluorine content of about 10 to 60 wt %. For example, the fluoropolymer included in the lift-off layer 120 may include at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene andperfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The lift-off layer 120 may be formed on the substrate 100 by, for example, a coating method, a printing method, or a deposition method. When the lift-off layer 120 is formed by a coating method or a printing method, a patterning process may be performed after a curing and polymerization process is performed.

The thickness of the lift-off layer 120 may be equal to or greater than about 0.2 μm and equal to or less than about 5 μm. When the thickness of the lift-off layer 120 is too thick, a time to melt the lift-off layer 120 for patterning increases, which may increase a manufacturing process time. When the thickness of the lift-off layer 120 is too thin, it may be difficult to perform a lift-off process.

Figure 3B:
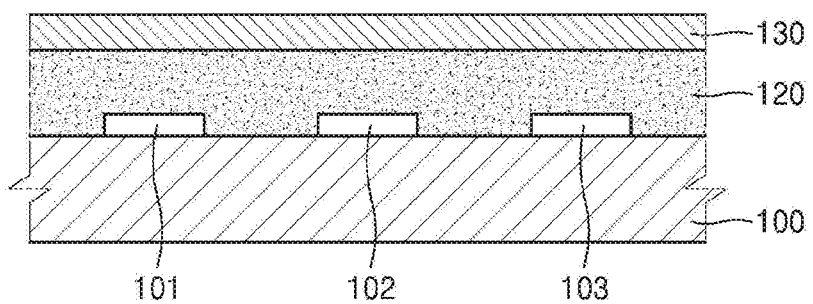

Referring to FIG. 3B, a polymer layer 130 is formed on the lift-off layer 120.

The polymer layer 130 may be formed by various polymer materials, which may generate glass transition within a temperature range provided by a drive roller DR1 (see FIG. 3C), to form a pattern by a roll-to-roll stamp process, which will be described in more detail with reference to FIG. 3C. The polymer layer 130 may further include UV cured resin or heat cured resin.

A glass transition temperature of the polymer layer 130 may be equal to or greater than 50° C. and equal to or less than 130° C. When the temperature is too low, it may be difficult to generate glass transition on the polymer layer 130. When the temperature is too high, thermal stress may be applied to the lift-off layer 120 or an organic functional layer 151 (see FIG. 3E) including a light-emitting layer.

Figure 3C:
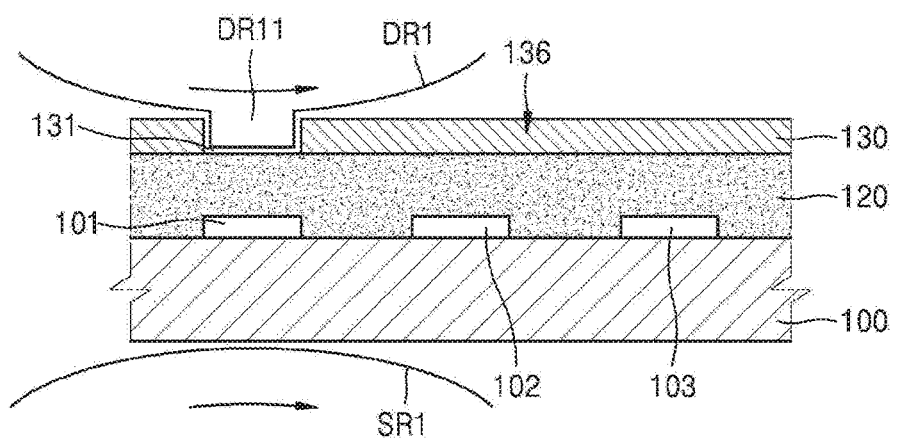

Referring to FIG. 3C, a first debossed pattern 131 is formed on the polymer layer 130 by a roll-to-roll stamp process. The structure of FIG. 3B is interposed between the drive roller DR1 and a support roller SR1.

While the driver roller DR1 is aligned, such that a first embossed pattern DR11 of the drive roller DR1 is located at a portion of the polymer layer 130 corresponding to the first anode 101, the drive roller DR1 is rotated to press the polymer layer 130. The support roller SR1 is located under the substrate 100 to support the substrate 100, while the drive roller DR1 proceeds over the polymer layer 130.

The drive roller DR1 may include a temperature regulator (not shown). A temperature range provided by the drive roller DR1 is higher than a glass transition temperature of the polymer layer 130. The polymer layer 130 reaching the glass transition temperature may be in a soft state. In this manner, the first debossed pattern 131 is formed in a portion of the polymer layer 130 stamped by the first embossed pattern DR11 of the drive roller DR1.

When the polymer layer 130 includes UV cured resin, the polymer layer 130 may be cured by forming the first debossed pattern 131 on the polymer layer 130 and then directly irradiating a UV light to the first debossed pattern 131. When the polymer layer 130 includes heat cured resin, the polymer layer 130 may be cured by forming the first debossed pattern 131 on the polymer layer 130, and then performing a thermal treatment process on the first debossed pattern 131. An area 136 of the polymer layer 130, where the first embossed pattern DR11 of the drive roller DR1 does not pass, remains un-patterned.

Although FIG. 3C illustrates a structure of forming the first debossed pattern 131 only on the polymer layer 130, the first debossed pattern 131 may be formed on an upper portion of the lift-off layer 120 by changing the structure of the first embossed pattern DR11 of the drive is roller DR1 or adjusting a stamping pressure.

Figure 3D:
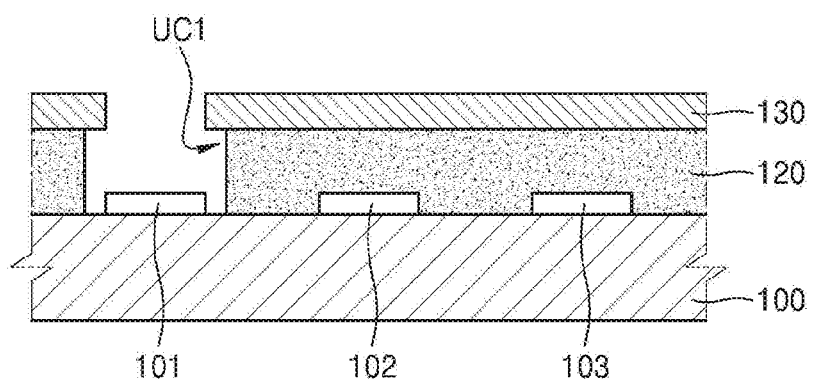

Referring to FIG. 3D, the lift-off layer 120 is etched by using the first debossed pattern 131 formed on the polymer layer 130 of FIG. 3C.

Since the lift-off layer 120 includes fluoropolymer, a solvent capable of etching the fluoropolymer may be used as an etchant. A first solvent (not shown) including fluorine may be used as the etchant. The first solvent may include hydrofluoroether. The hydrofluoroether is an electrochemically stable material due to its low interaction with other materials, and is an environmentally stable material due to its low global warming potential and toxicity.

In an etching process, a portion of the lift-off layer 120 corresponding to the first debossed pattern 131, that is, above the first anode 101, is etched. More particularly, the portion of the lift-off layer 120 disposed on the first anode 101 is etched using the above-described first solvent including hydrofluoroether.

During the etching of the lift-off layer 120, the first solvent including fluorine forms a first undercut profile UC1 in the lift-off layer 120 disposed under an interface of the area 136 (see FIG. 3E), where the polymer layer 130 remains.

The first undercut profile UC1 may enable forming a delicate deposition pattern of the first organic light-emitting layer 151 in a deposition process, which will be described in more detail with reference to FIG. 3E, and a clear removal of the lift-off layer 120 remaining on the substrate 100 in a lift-off process, which will be described in more detail with reference to FIG. 3F.

Figure 3E:
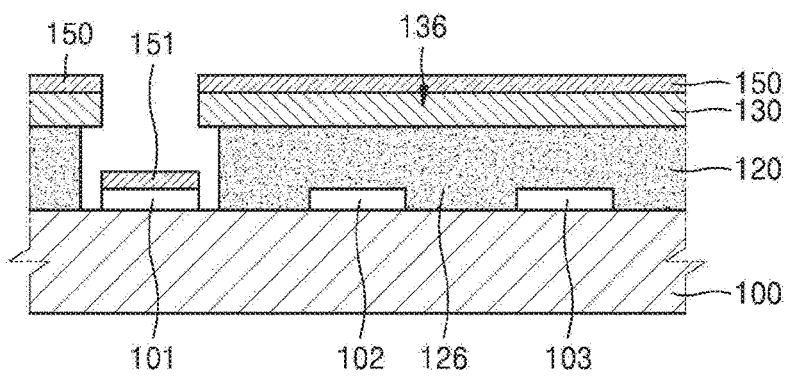

Referring to FIG. 3E, a first organic functional layer 150 including a first organic light-emitting layer 151 is formed on the structure of FIG. 3D. The first organic functional layer 150 may further include at least one of a hole injection layer, a hole transport layer, an electron transport layer, and an electron injection layer. In the present exemplary embodiment, the first organic light-emitting layer 151 is used as an example of the first organic functional layer 150. Hereinafter, for descriptive convenience, the first organic functional layer and the first organic light-emitting layer may have the same reference numeral.

The first organic light-emitting layer 150 may be formed by a vacuum deposition method. In the deposition process, the lift-off layer 120 and the polymer layer 130 function as masks. In this manner, a portion 151 of the first organic light-emitting layer 150 is disposed on the first anode 101, and the first organic light-emitting layer 150 is disposed on the area 136, where the polymer layer 130 remains.

Figure 3F:
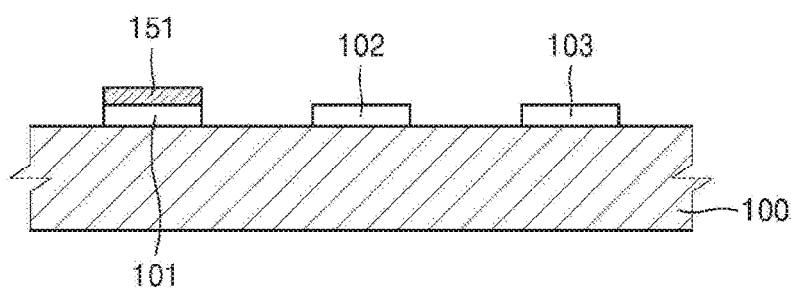

Referring to FIG. 3F, a lift-off process is performed on the structure of FIG. 3E.

Since the lift-off layer 120 includes fluoropolymer, a second solvent including fluorine is used in the lift-off process. Since the lift-off process is performed after the first organic light-emitting layer 150 is formed, a material having a low reactivity to the organic light-emitting layer 150 is used as the second solvent. The second solvent may include hydrofluoroether.

As a lift-off layer 126 formed under the area 136 where the polymer layer 130 remains (see FIG. 3E) is lifted off, the first organic light-emitting layer 150 disposed on the area 136, where the polymer layer 130 remains, is removed, and, thus the first organic light-emitting layer 151 formed on the first anode 101 is left as a pattern.

According to the present exemplary embodiment, since the pattern of the first organic light-emitting layer 151 is formed in the lift-off process, rather than being deposited using a metal mask (not shown) having an opening, a misalignment between the substrate 100 and the metal mask may be prevented. Also, since the patterning of the lift-off layer 120 is performed by a roll-to-roll stamp process, rather than a photolithography process, process costs may be reduced.

A second unit process of forming a second organic light-emitting layer 162 (see FIG. 4F) emitting light of a color different from that of the first organic light-emitting layer 151 is performed in an area where the second anode 102 is disposed, after performing the above-described first unit process. The second unit process will be described below with reference to FIGS. 4A to 4F.

Figure 4A:
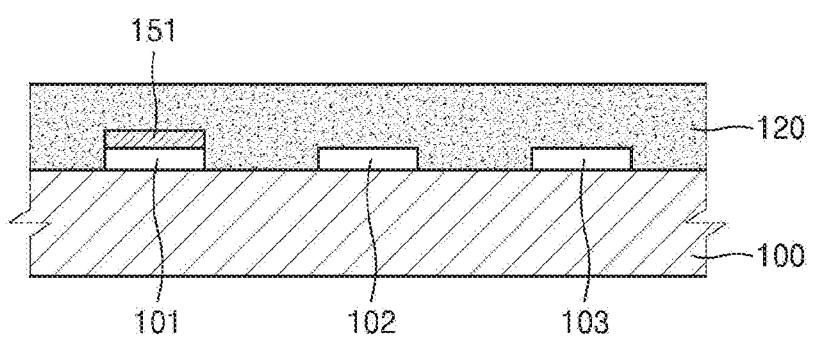
FIG. 4A, FIG. 4B, FIG. 4C, FIG. 4D, FIG. 4E, and FIG. 4F are cross-sectional views schematically illustrating a second unit operation of the manufacturing method of FIG. 1.

Referring to FIG. 4A, the lift-off layer 120 including fluoropolymer is formed on the substrate 100 where the first, second, and third anodes 101, 102, and 103 are formed.

The lift-off layer 120 may include a material that is the same as or different from the fluoropolymer used in the first unit process. The lift-off layer 120 may be formed on the substrate 100 by, for example, a coating method, a printing method, or a deposition method.

Figure 4B:
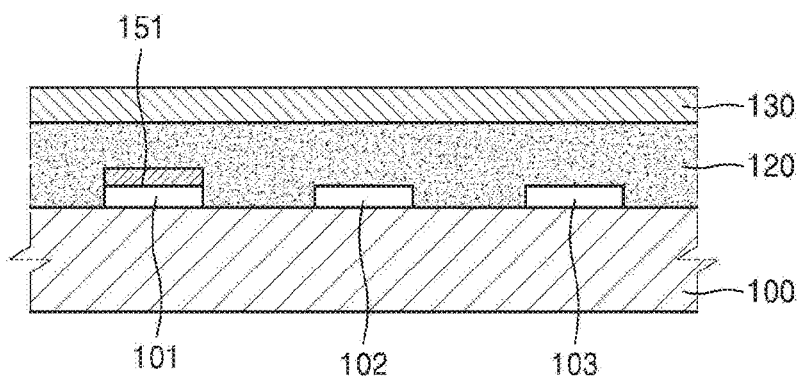

Referring to FIG. 4B, the polymer layer 130 is formed on the lift-off layer 120.

The polymer layer 130 may be formed by various polymer materials, which may generate glass transition within a temperature range provided by a drive roller DR2 (see FIG. 4C), to form a pattern by a roll-to-roll stamp process, which will be described in more detail with reference to FIG. 4C. The polymer layer 130 may include a material that is the same as or different from the polymer layer used in the first unit process Referring to FIG. 4C, a second debossed pattern 132 is formed on the polymer layer 130 by a roll-to-roll stamp process. The structure of FIG. 4B is interposed between the drive roller DR2 and a support roller SR2.

While the driver roller DR2 is aligned, such that a second embossed pattern DR22 of the drive roller DR2 is located at a portion of the polymer layer 130 corresponding to the is second anode 102, the drive roller DR2 is rotated to press the polymer layer 130. The support roller SR2 is located under the substrate 100 to support the substrate 100, while the drive roller DR2 proceeds over the polymer layer 130.

The polymer layer 130 reaching the glass transition temperature by heat transferred by the drive roller DR2 may be in a soft state. In this manner, the second debossed pattern 132 is formed in a portion of the polymer layer 130 stamped by the second embossed pattern DR22 of the drive roller DR2. An area 137 of the polymer layer 130, where the second embossed pattern DR22 of the drive roller DR2 does not pass, remains un-patterned.

Figure 4C:
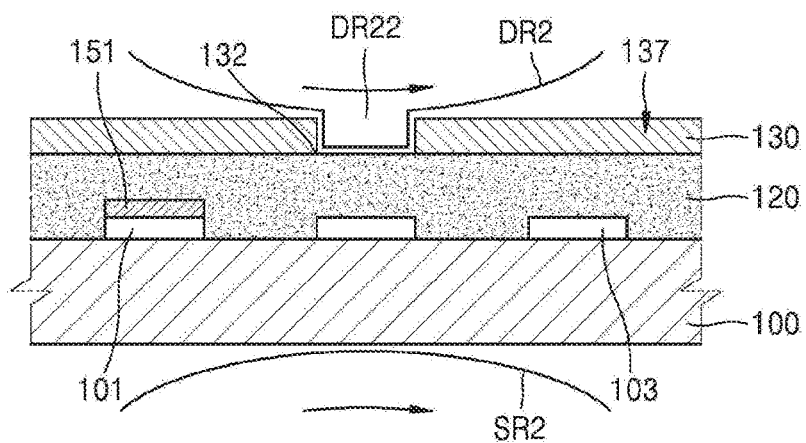

Although FIG. 4C illustrates a structure of forming the second debossed pattern 132 only on the polymer layer 130, the second debossed pattern 132 may be formed on an upper portion of the lift-off layer 120 by changing the structure of the second embossed pattern DR22 of the drive roller DR2 or adjusting a stamping pressure.

Figure 4D:
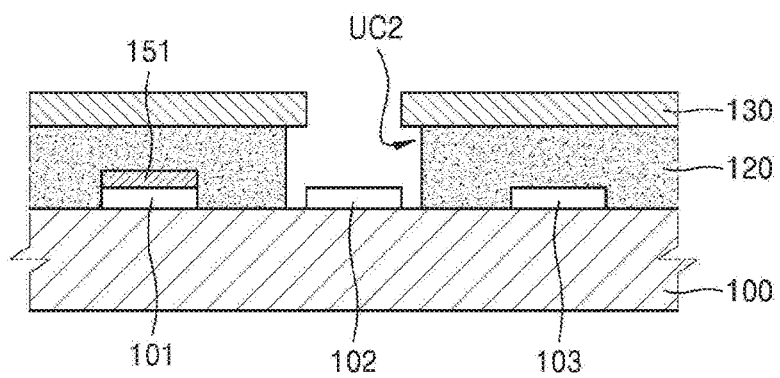

Referring to FIG. 4D, the lift-off layer 120 is etched by using the second debossed pattern 132 formed on the polymer layer 130 of FIG. 4C. Since the lift-off layer 120 includes fluoropolymer, a solvent capable of etching fluoropolymer may be used as an etchant. A first solvent (not shown) including fluorine may be used as the etchant. The first solvent may include hydrofluoroether, as in the above-described first unit process. The content of fluorine of the first solvent may be different from that utilized in the in the first unit process.

In the etching process, a portion of the lift-off layer 120 corresponding to the second debossed pattern 132, that is, above the second anode 102, is etched. More particularly, the portion of the lift-off layer 120 disposed on the second anode 102 is etched using the above-described first solvent including hydrofluoroether.

During the etching of the lift-off layer 120, the first solvent including fluorine forms a second undercut profile UC2 in the lift-off layer 120 disposed under an interface of the area 137 (see FIG. 4E), where the polymer layer 130 remains.

Figure 4E:
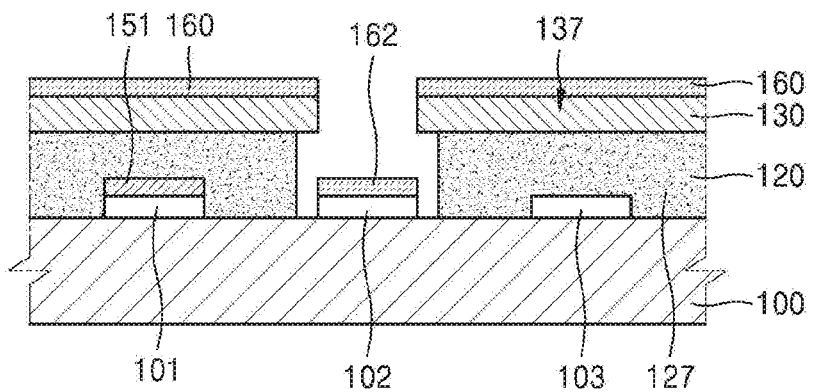

Referring to FIG. 4E, a second organic functional layer 160 including a second organic light-emitting layer is formed on the structure of FIG. 4D. The second organic functional layer 160 may include at least one functional layer of a hole injection layer, a hole transport layer, an electron injection layer, and an electron injection layer. In the present exemplary embodiment, the second organic light-emitting layer is used as an example of the second organic functional layer 160. Hereinafter, for convenience of description, the second organic functional layer and the second organic light-emitting layer may have the same reference numeral.

The second organic light-emitting layer 160 may be formed by a vacuum deposition method. In the deposition process, the lift-off layer 120 and the polymer layer 130 function as masks. In this manner, a portion 162 of the second organic light-emitting layer 160 is disposed on the second anode 102, and the second organic light-emitting layer 160 is formed on the area 137, where the polymer layer 130 remains.

Figure 4F:
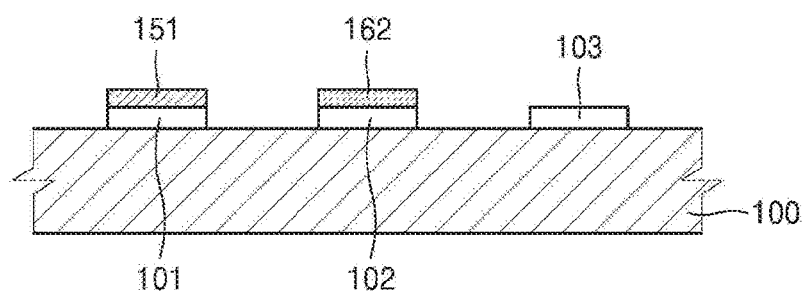

Referring to FIG. 4F, a lift-off process is performed on the structure of FIG. 4E.

Since the lift-off layer 120 includes fluoropolymer, a second solvent including fluorine is used in the lift-off process. Since the lift-off process is performed after the second organic light-emitting layer 160 is formed, a material having a low reactivity to the second organic light-emitting layer 160 may be used as the second solvent. The second solvent may include hydrofluoroether, like the first solvent.

As a lift-off layer 127 formed under the area 137 (see FIG. 4E), where the polymer layer 130 remains, is lifted off, the second organic light-emitting layer 160 disposed on the area 137, where the polymer layer 130 remains, is removed, and the second organic light-emitting layer 162 formed on the second anode 102 is left as a pattern.

A third unit process of forming a third organic light-emitting layer 173 (see FIG. 5F) emitting light of a color different from that of the first and second organic light-emitting layers 151 and 162 is performed in an area where the third anode 103 is located, after performing the above-described first and second unit processes. The third unit process will be described below with reference to FIGS. 5A to 5F.

Figure 5A:
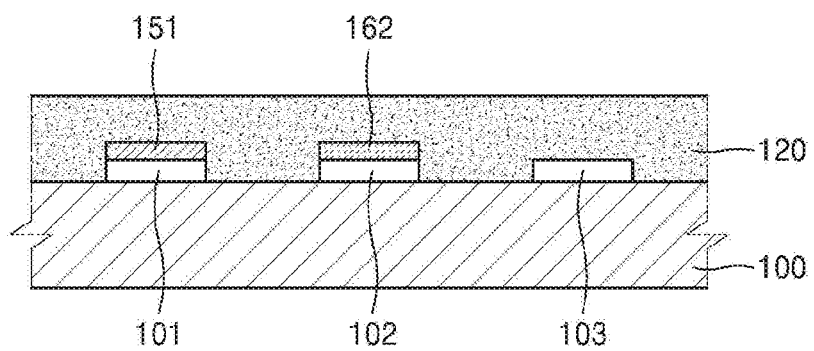
FIG. 5A, FIG. 5B, FIG. 5C, FIG. 5D, FIG. 5E, and FIG. 5F are cross-sectional views schematically illustrating a third unit operation of the manufacturing method of FIG. 1.
Figure 6:
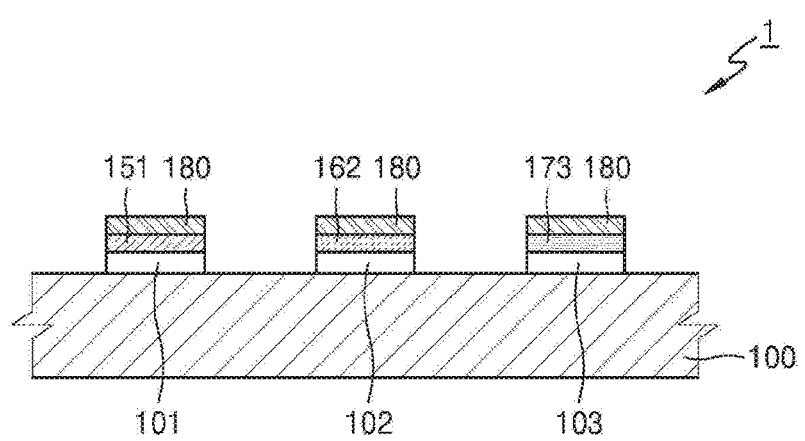
FIG. 6 is a schematic cross-sectional view of an organic light-emitting display apparatus manufactured by the manufacturing method of FIG. 1.

Referring to FIG. 5A, the lift-off layer 120 including fluoropolymer is formed on the substrate 100 where the first, second, and third anodes 101, 102, and 103 are formed.

The lift-off layer 120 may include a material that is the same as or different from the fluoropolymer used in the first and second unit processes. The lift-off layer 120 may be formed on the substrate 100 by, for example, a coating method, a printing method, or a deposition method.

Figure 5B:
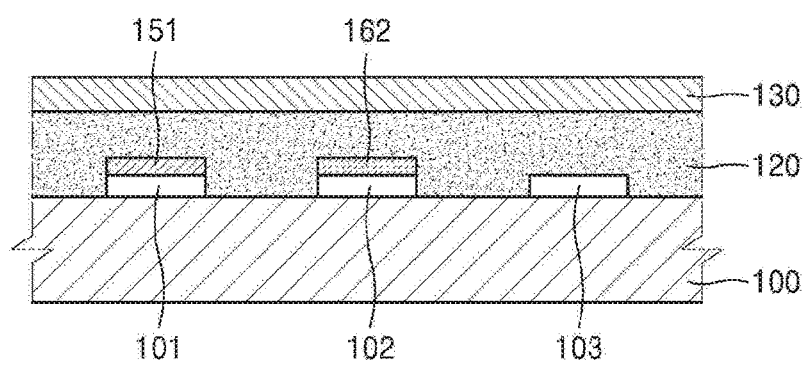

Referring to FIG. 5B, the polymer layer 130 is formed on the lift-off layer 120.

The polymer layer 130 may be formed by various polymer materials, which may generate glass transition within a temperature range provided by a drive roller DR3 (see FIG. 5C) to form a pattern, by a roll-to-roll stamp process. The polymer layer 130 may include a material that is the same as or different from the polymer layer used in the first and second unit processes.

Figure 5C:
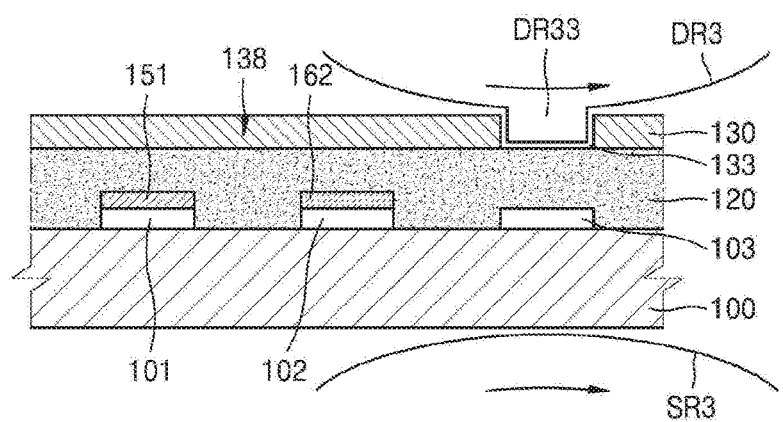

Referring to FIG. 5C, a third debossed pattern 133 is formed on the polymer layer 130 by a roll-to-roll stamp process. The structure of FIG. 5B is interposed between the drive roller DR3 and a support roller SR3.

While the driver roller DR3 is aligned, such that a third embossed pattern DR33 of the drive roller DR3 is located at a portion of the polymer layer 130 corresponding to the third anode 103, the drive roller DR3 is rotated to press the polymer layer 130. The support roller SR3 is located under the substrate 100 to support the substrate 100 while the drive roller DR3 proceeds over the polymer layer 130.

The polymer layer 130 reaching the glass transition temperature by heat transferred by the drive roller DR3 may be in a soft state. In this manner, the third debossed pattern 133 is formed in a portion of the polymer layer 130 stamped by the third embossed pattern DR33 of the drive roller DR3. An area 138 of the polymer layer 130, where the third embossed pattern DR33 of the drive roller DR3 does not pass, remains un-patterned.

Although FIG. 5C illustrates a structure of forming the third debossed pattern 133 only on the polymer layer 130, the third debossed pattern 133 may be formed on an upper portion of the lift-off layer 120 by changing the structure of the third embossed pattern DR33 of the drive roller DR3 or adjusting a stamping pressure.

Figure 5D:
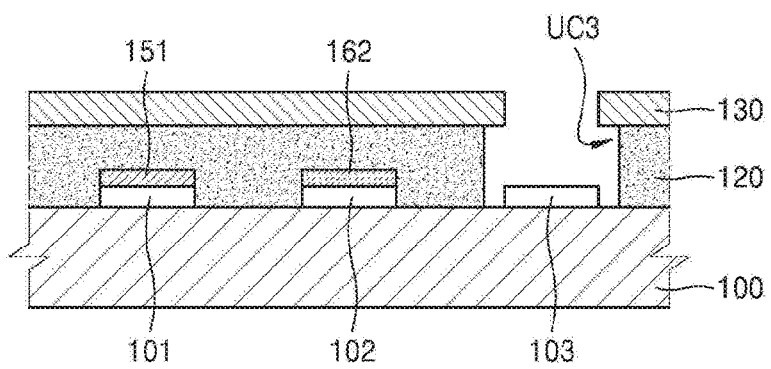

Referring to FIG. 5D, the lift-off layer 120 is etched using the third debossed pattern 133 formed on the polymer layer 130 of FIG. 5C.

Since the lift-off layer 120 includes fluoropolymer, a solvent capable of etching fluoropolymer may be used as an etchant. A first solvent (not shown) including fluorine may be used as the etchant. The first solvent may include hydrofluoroether, as in the above-described first unit process. The content of fluorine in the first solvent may be different from that utilized in the in the first unit process.

In the etching process, a portion of the lift-off layer 120 corresponding to the third debossed pattern 133, that is, above the third anode 103, is etched. More particularly, the portion of the lift-off layer 120 disposed on the third anode 103 is etched using the above-described first solvent including hydrofluoroether.

During the etching of the lift-off layer 120, the first solvent including fluorine forms a third undercut profile UC3 in the lift-off layer 120 disposed under an interface of the area 138 (see FIG. 5E) where the polymer layer 130 remains.

Figure 5E:
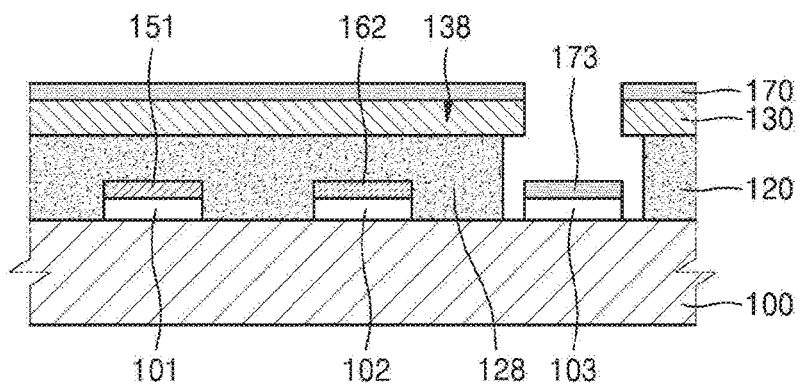

Referring to FIG. 5E, the third organic functional layer 170 including a third organic light-emitting layer is disposed on the structure of FIG. 5D. The third organic functional layer 170 may further include at least one functional layer of a hole injection layer, a hole transport layer, an electron injection layer, and an electron injection layer. In the present exemplary embodiment, the third organic light-emitting layer is used as an example of the third organic functional layer 170. Hereinafter for descriptive convenience, the third organic functional layer and the third organic light-emitting layer may have the same reference numeral.

The third organic light-emitting layer 170 may be formed by a vacuum deposition method. In the deposition process, the lift-off layer 120 and the polymer layer 130 function as masks. In this manner, a portion 173 of the third organic light-emitting layer 170 is disposed on the third anode 103, and the third organic light-emitting layer 170 is formed on the area 138, where the polymer layer 130 remains.

Figure 5F:
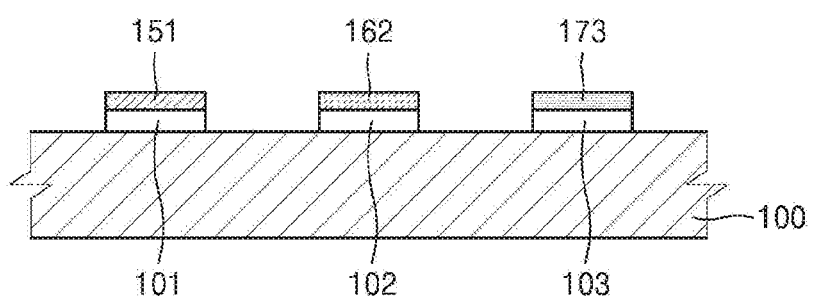

Referring to FIG. 5F, a lift-off process is performed on the structure of FIG. 5E.

Since the lift-off layer 120 includes fluoropolymer, a second solvent including fluorine is used in the lift-off process. Since the lift-off process is performed after the third organic light-emitting layer 170 is formed, a material having a low reactivity to the third organic light-emitting layer 170 may be used as the second solvent. The second solvent may include hydrofluoroether, like the first solvent.

As a lift-off layer 128 formed under the area 138 (see FIG. 5E), where the polymer layer 130 remains, is lifted off, the third organic light-emitting layer 170 disposed on the area 137, where the polymer layer 130 remains, is removed, and, thus the portion 173 of the third organic light-emitting layer 170 disposed on the third anode 103 is left as a pattern.

Referring to FIG. 6, after the first, second, and third organic functional layers 151, 162, and 173 are formed through the first, second, and third unit processes, a cathode 180 is disposed thereon as a common layer.

Although FIG. 6 illustrates that the cathodes 180 formed on the first to third anodes 101, 102, and 103 are separately formed, the present disclosure is not limited thereto and the cathodes 180 may be integrally formed.

The first, second, and third organic light-emitting layers 151, 162, and 173 may emit lights of different colors. The light emitted by the first to third organic light-emitting layers 151, 162, and 173 may appear as a white light when mixed together. For example, the first to third organic light-emitting layers 151, 162, and 173 may emit light of red, green, and blue, respectively. For example, the first to third organic light-emitting layers 151, 162, and 173 may define subpixels forming a unit pixel of the organic light-emitting display apparatus 1. The organic light-emitting display apparatus 1 of FIG. 6 may indicate one unit pixel.

The organic light-emitting display apparatus according to the present exemplary embodiment illustrated with reference to FIG. 6 may be applied to an organic light-emitting display apparatus having multiple unit pixels.

For example, referring to FIG. 3C, in the first unit process, the first debossed patterns 131 may be formed on the polymer layer 130 by using the drive roller DR1 having the first embossed patterns DR11, and the first organic light-emitting layers 151 for emitting a first color may be simultaneously formed on the first anodes 101 using the first debossed patterns 131 as etching masks.

In the second unit process, referring to FIG. 4C, the second debossed patterns 132 may be formed on the polymer layer 130 by using the drive roller DR2 having the second embossed patterns DR22, and the second organic light-emitting layers 162 for emitting a second color may be simultaneously formed on the second anodes 102 using the second debossed patterns 132 as etching masks.

In the third unit process, referring to FIG. 5C, the third debossed patterns 133 may be formed on the polymer layer 130 by using the drive roller DR3 having the third embossed patterns DR33, and the third organic light-emitting layers 173 for emitting a third color may be simultaneously formed on the third anodes 103 using the third debossed patterns 133 as etching masks. In this manner, the organic light-emitting display apparatus 1 may embody a full color through the above-described first to third unit processes.

Figure 7:
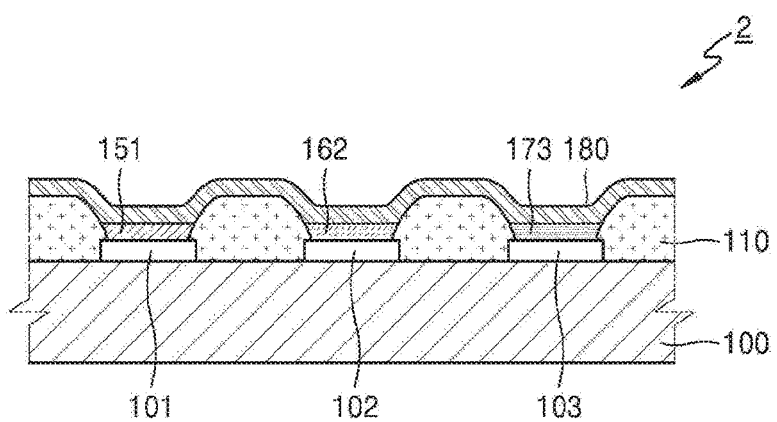
FIG. 7 is a schematic cross-sectional view of an organic light-emitting display apparatus manufactured by a manufacturing method according to an exemplary embodiment of the present invention.

FIG. 7 is a schematic cross-sectional view of an organic light-emitting display apparatus 2 manufactured by a manufacturing method according to an exemplary embodiment of the present invention.

A manufacturing method of the organic light-emitting display apparatus 2 of FIG. 7 may be similar to the above-described manufacturing method of the organic light-emitting display apparatus 1 of FIG. 6. Hereinafter, differences from the above-described manufacturing method of the organic light-emitting display apparatus 1 of FIG. 6 will be mainly described.

Referring to FIG. 7, first, second, and third anodes 101, 102, and 103 are formed on the substrate 100. A pixel-defining layer 110 is disposed to surround the edges of the first to third anodes 101, 102, and 103. The pixel-defining layer 110 defines a light-emitting area and prevents short-circuit between the first to third anodes 101, 102, and 103 and a cathode 180.

In the present exemplary embodiment, the first, second, and third unit processes are performed after forming the first to third anodes 101, 102, and 103 and the pixel-defining layer 110. Through the first to third unit processes, the first, second, and third organic light-emitting layers 151, 162, and 173 are respectively formed on the first, second, and third anodes 101, 102, and 103, and the cathode 180 is formed as a common layer.

Figure 8:
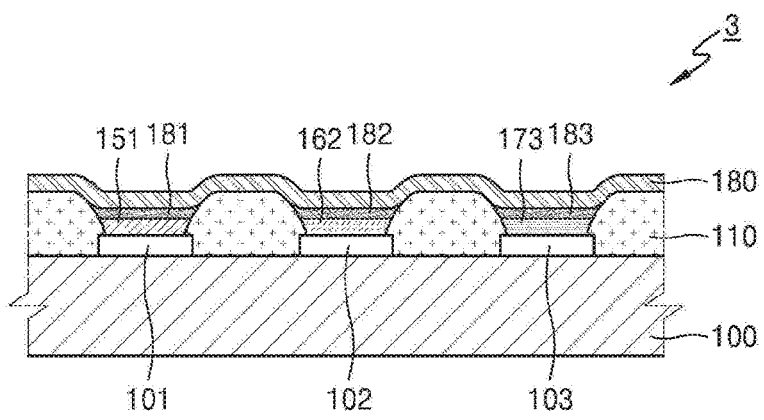
FIG. 8 is a schematic cross-sectional view of an organic light-emitting display apparatus manufactured by a manufacturing method according to an exemplary embodiment of the present invention.

FIG. 8 is a schematic cross-sectional view of an organic light-emitting display apparatus 3 manufactured by a manufacturing method according to an exemplary embodiment of the present invention.

A manufacturing method of the organic light-emitting display apparatus 3 of FIG. 8 may be similar to the above-described manufacturing method of the organic light-emitting display apparatus 2 of FIG. 7. Hereinafter, differences from the above-described manufacturing method of the organic light-emitting display apparatus 2 of FIG. 7 will be mainly described.

Referring to FIG. 8, anodes including first, second, and third anodes 101, 102, and 103 are formed on the substrate 100. The pixel-defining layer 110 is disposed to surround the edges of the first to third anodes 101, 102, and 103. The pixel-defining layer 110 defines a light-emitting area and prevents short-circuit between the first to third anodes 101, 102, and 103 and the cathode 180. In the present exemplary embodiment, the first, second, and third unit processes are performed after forming the first to third anodes 101, 102, and 103 and the pixel-defining layer 110.

In the first unit process, referring back to FIG. 3C, the lift-off layer 120 disposed on the first anode 101 is etched by a roll-to-roll stamping process and an etching process. Next, the first organic light-emitting layer 151 is formed on the first anode 101 by a deposition process. When the first organic light-emitting layer 151 is formed, a first auxiliary cathode 181 is continuously deposited on the first organic light-emitting layer 151 and a lift-off process is performed.

During the lift-off process, a second solvent (not shown) including fluorine is used. The second solvent including fluorine may damage the first organic light-emitting layer 151. As such, the first auxiliary cathode 181 functions as a barrier with respect to the first organic light-emitting layer 151 during the lift-off process.

After the first unit process, the second unit process is performed. Referring back to FIG. 4C, the lift-off layer 120 disposed on the second anode 102 is etched by a roll-to-roll stamping process and an etching process. Next, the second organic light-emitting layer 162 is formed on the second anode 102 by a deposition process. When the second organic light-emitting layer 162 is formed, a second auxiliary cathode 182 is continuously deposited on the second organic light-emitting layer 162, and a lift-off process is performed.

During the lift-off process, a second solvent (not shown) including fluorine is used. The second solvent including fluorine may damage the second organic light-emitting layer 162. As such, the second auxiliary cathode 182 functions as a barrier with respect to the second organic light-emitting layer 162 during the lift-off process.

After the second unit process, the third unit process is performed. Referring back to FIG. 5C, the lift-off layer 120 disposed on the third anode 103 is etched by a roll-to-roll stamping process and an etching process. Next, the third organic light-emitting layer 173 is formed on the third anode 103 by a deposition process. When the third organic light-emitting layer 173 is formed, a third auxiliary cathode 183 is continuously deposited on the third organic light-emitting layer 173, and a lift-off process is performed.

During the lift-off process, a second solvent (not shown) including fluorine is used. The second solvent including fluorine may damage the third organic light-emitting layer 173. As such, the third auxiliary cathode 183 functions as a barrier with respect to the third organic light-emitting layer 173 during the lift-off process. After the first to third unit processes are performed, the cathode 180 is formed as a common layer.

According to the manufacturing method of FIG. 8, since the first, second, and third auxiliary cathodes 181, 182, and 183 are continuously deposited on the first, second, and third organic light-emitting layers 151, 162, and 173, respectively, during the deposition of the first to third organic light-emitting layers 151, 162, and 173 in the respective unit processes, the first to third organic light-emitting layers 151, 162, and 173 may be prevented from being damaged in the subsequent lift-off process. In addition, since the first to third auxiliary cathodes 181, 182, and 183 electrically contact the cathode 180, which is commonly formed on pixels after the first to third unit processes, voltage drop of the cathode 180 may be prevented.

Figure 9:
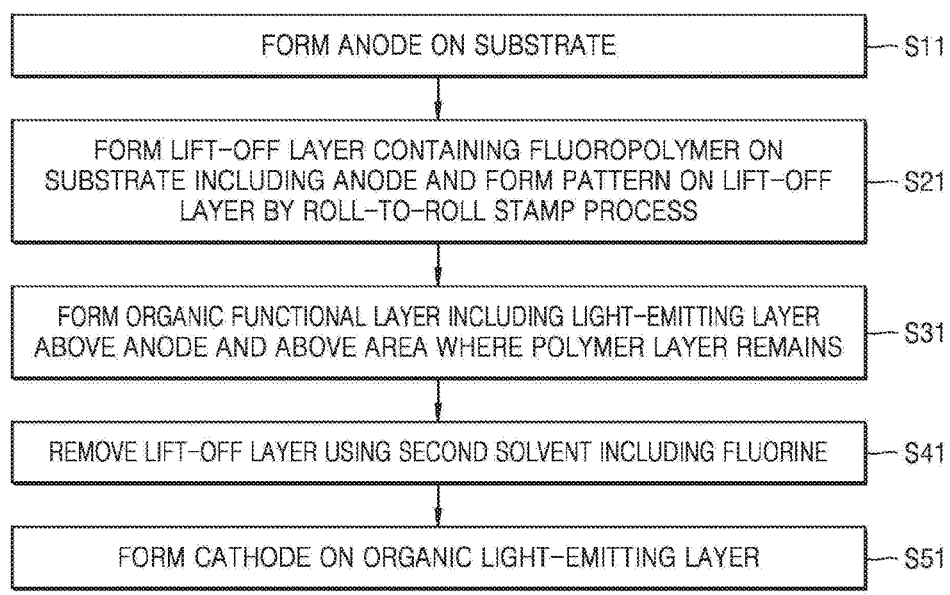
FIG. 9 is a flowchart of a manufacturing method of an organic light-emitting display apparatus according to an exemplary embodiment of the present invention.

FIG. 9 is a flowchart of a manufacturing method according to an exemplary embodiment of the present invention.

Referring to FIG. 9, in the method of manufacturing an organic light-emitting display apparatus 1 according to the present exemplary embodiment, an anode is formed on a substrate, per step S11. In step S21, the lift-off layer including fluoropolymer is formed on the substrate including the anode, and a pattern is formed on the lift-off layer by a roll-to-roll stamp process.

In step S31, an organic functional layer including a light-emitting layer is formed above the anode and above an area where the polymer layer remains. In step S41, the lift-off layer is removed using a solvent including. In step S51, a cathode is formed on the organic light-emitting layer.

The manufacturing method according to an exemplary embodiment of the present invention is described in detail with reference to FIGS. 10A to 12D.

FIGS. 10A to 10D are cross-sectional views schematically illustrating a first unit operation of the manufacturing method of FIG. 9. FIGS. 11A to 11D are cross-sectional views schematically illustrating a second unit operation of the manufacturing method of FIG. 9. FIGS. 12A to 12D are cross-sectional views schematically illustrating a third unit operation of the manufacturing method of FIG. 9.

Figure 10A:
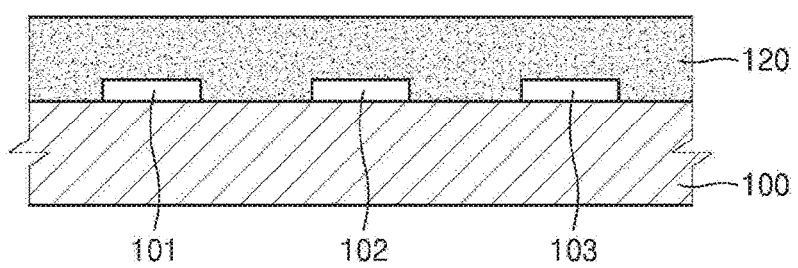
FIG. 10A, FIG. 10B, FIG. 10C, and FIG. 10D are cross-sectional views schematically illustrating a first unit operation of the manufacturing method of FIG. 9.

Referring to FIG. 10A, a lift-off layer 120 including fluoropolymer is formed on a substrate 100, on which the first to third anodes 101, 102, and 103 are formed.

Figure 10B:
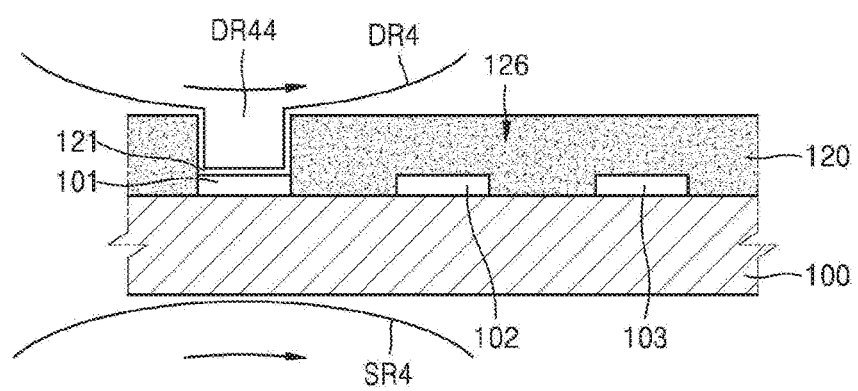

Referring to FIG. 10B, a first debossed pattern 121 is formed on the lift-off layer 120 by a roll-to-roll stamp process. In the present exemplary embodiment, the first debossed pattern 121 is formed directly on the lift-off layer 120 without forming the polymer layer 130 of FIG. 3B.

The lift-off layer 120 may include fluoropolymer having a fluorine content of about 10 to 60 wt %. The lift-off layer 120 may be formed by various polymer materials, which may generate glass transition within a temperature range provided by a drive roller DR4. The structure of FIG. 10A is interposed between the drive roller DR4 and a support roller SR4.

A glass transition temperature of the lift-off layer 120 may be equal to or greater than 50° C. and equal to or less than 130° C. When the temperature is too low, it may be difficult to generate glass transition on the lift-off layer 120. When the temperature is too high, thermal stress may be applied to an organic functional layer 151 (see FIG. 10C) including a light-emitting layer.

While the driver roller DR4 is aligned, such that a first embossed pattern DR44 of the drive roller DR4 is located at a portion of the lift-off layer 120 corresponding to the first anode 101, the drive roller DR4 is rotated to press the lift-off layer 120. The support roller SR4 is located under the substrate 100 to support the substrate 100 while the drive roller DR4 proceeds over the lift-off layer 120.

A portion of the lift-off layer 120 reaching the glass transition temperature, due to heat transferred by the drive roller DR4, may be in a soft state. The first debossed pattern 121 is formed in a portion of the lift-off layer 120 stamped by the first embossed pattern DR44 of the drive roller DR4. An area 126 of the lift-off layer 120, where the first embossed pattern DR44 of the drive roller DR4 does not pass, remains un-patterned.

Figure 10C:
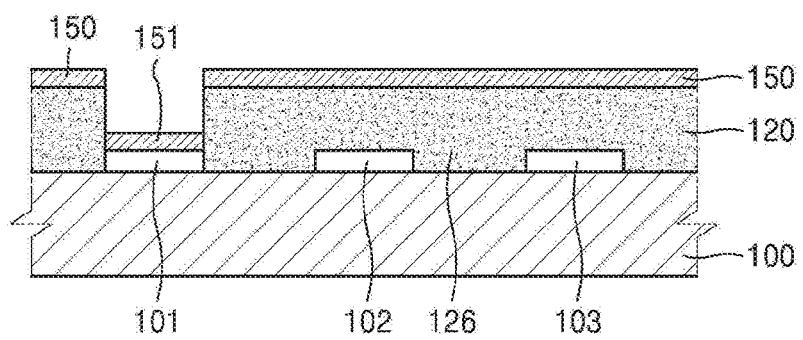

Referring to FIG. 10C, a first organic functional layer 150 including the first organic light-emitting layer is formed on the structure of FIG. 10B. The first organic functional layer 150 may further include at least one of a hole injection layer, a hole transport layer, an electron transport layer, and an electron injection layer. In the present exemplary embodiment, the first organic light-emitting layer is used as an example of the first organic functional layer 150. Hereinafter, the first organic functional layer and the first organic light-emitting layer may have the same reference numeral.

The first organic light-emitting layer 150 may be formed by a vacuum deposition method. In the deposition process, the lift-off layer 120 functions as a mask. In this manner, a portion 151 of the first organic light-emitting layer 150 is disposed on the first anode 101, and io the first organic light-emitting layer 150 is formed in the area 126 where the lift-off layer 120 remains.

Figure 10D:
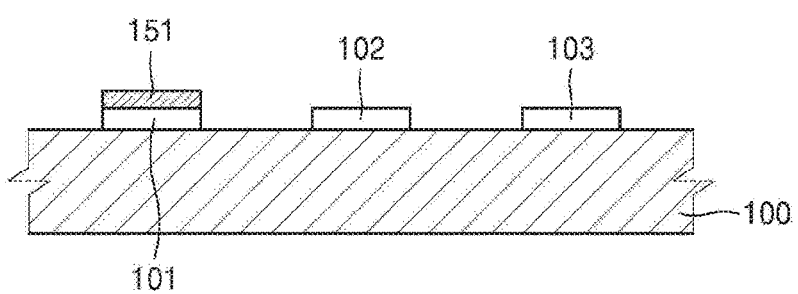

Referring to FIG. 10D, a lift-off process is performed on the structure of FIG. 10C.

Since the lift-off layer 120 includes fluoropolymer, a second solvent including fluorine is used in the lift-off process. Since the lift-off process is performed after the first organic light-emitting layer 150 is formed, a material having a low reactivity to the organic light-emitting layer 150 is used as the second solvent. The second solvent may include hydrofluoroether, like the first solvent.

As the lift-off layer 120 disposed in an area 126 is lifted off, the first organic light-emitting layer 150 disposed on the area 126, where the lift-off layer 120 remains, is removed, and, thus the first organic light-emitting layer 151 formed on the first anode 101 is left as a pattern.

According to the present exemplary embodiment, since the lift-off layer 120 is used as an etching mask without separately forming the polymer layer 130, a manufacturing process may be simplified, and, thus process costs may be reduced.

A second unit process of forming a second organic light-emitting layer 162 (see FIG. 11D) emitting light of a color different from that of the first organic light-emitting layer 151 is performed in an area where the second anode 102 is disposed, after performing the above-described first unit process. The second unit process is described below with reference to FIGS. 11A to 11D.

Figure 11A:
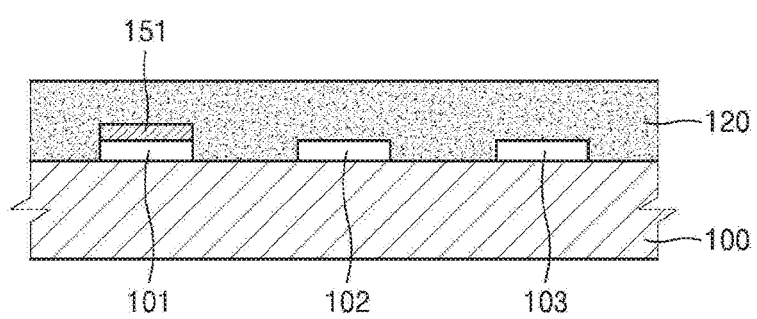
FIG. 11A, FIG. 11B, FIG. 11C, and FIG. 11D are cross-sectional views schematically illustrating a second unit operation of the manufacturing method of FIG. 9.

Referring to FIG. 11A, the lift-off layer 120 including fluoropolymer is formed on the substrate 100, on which the first to third anodes 101, 102, and 103 are formed.

Figure 11B:
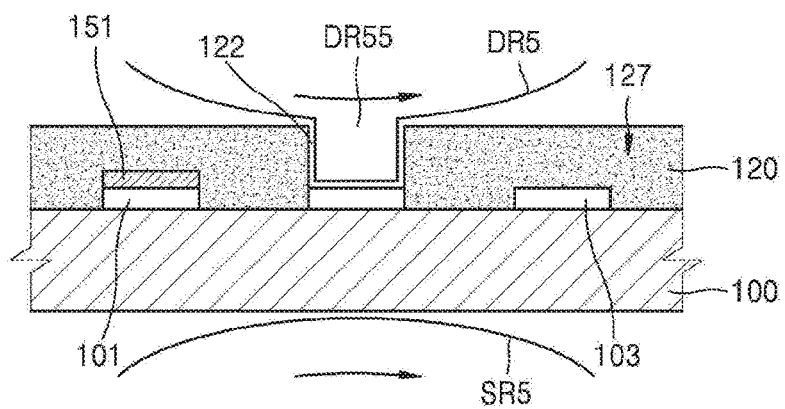

Referring to FIG. 11B, a second debossed pattern 122 is formed on the lift-off layer 120 by a roll-to-roll stamp process. In the present exemplary embodiment, the second debossed pattern 122 is formed directly on the lift-off layer 120 without forming the polymer layer 130 of FIG. 4B.

The lift-off layer 120 may include fluoropolymer having a fluorine content of is about 10 to 60 wt %. The lift-off layer 120 may be formed by various polymer materials, which may generate glass transition within a temperature range provided by a drive roller DR5. The structure of FIG. 11A is interposed between the drive roller DR5 and a support roller SR5.

While the driver roller DR5 is aligned, such that a second embossed pattern DR55 of the drive roller DR5 is located at a portion of the lift-off layer 120 corresponding to the second anode 102, the drive roller DR5 is rotated to press the lift-off layer 120. The support roller SR5 is located under the substrate 100 to support the substrate 100 while the drive roller DR5 proceeds over the lift-off layer 120.

A portion of the lift-off layer 120 reaching the glass transition temperature, due to heat transferred by the drive roller DR5, may be in a soft state. The second debossed pattern 122 is formed in a portion of the lift-off layer 120 stamped by the second embossed pattern DR55 of the drive roller DR5. An area 127 of the lift-off layer 120, where the second embossed pattern DR55 of the drive roller DR5 does not pass, remains un-patterned.

Figure 11C:
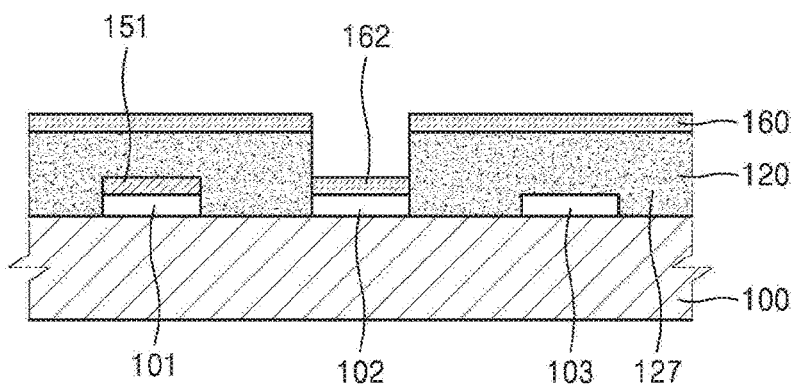

Referring to FIG. 11C, the second organic functional layer 160 including the second organic light-emitting layer is formed on the structure of FIG. 11B. In the present exemplary embodiment, the second organic light-emitting layer is used as an example of the second organic functional layer 160. Hereinafter, for descriptive convenience, the second organic functional layer and the second organic light-emitting layer may have the same reference numeral.

The portion 162 of the second organic light-emitting layer 160 is disposed on the second anode 102, and the second organic light-emitting layer 160 is formed in the area 127 where the lift-off layer 120 remains.

Figure 11D:
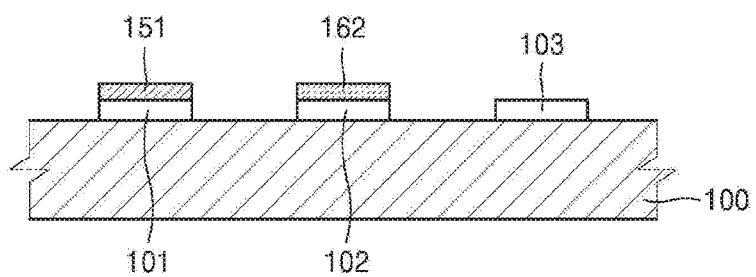

Referring to FIG. 11D, a lift-off process is performed on the structure of FIG. 11C.

As the lift-off layer 120 disposed in an area 127 is lifted off, the second organic light-emitting layer 160 disposed on the area 127, where the lift-off layer 120 remains, is removed, and, thus the second organic light-emitting layer 162 formed on the second anode 102 is left as a pattern.

A third unit process of forming a third organic light-emitting layer 173 (see FIG. 12D) emitting light of a color different from that of the second organic light-emitting layer 162 is performed in an area where the third anode 103 is disposed, after performing the above-described second unit process. The third unit process is described below with reference to FIGS. 12A to 12D.

Figure 12A:
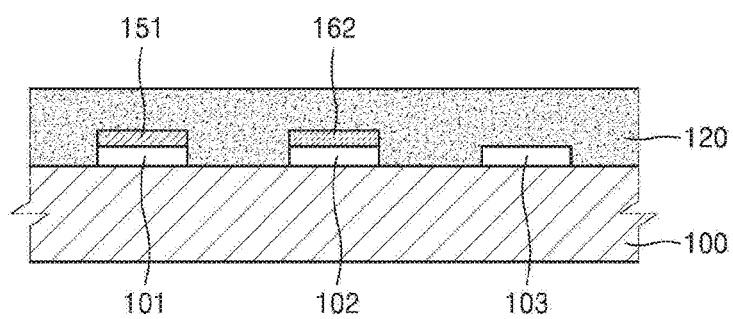
FIG. 12A, FIG. 12B, FIG. 12C, and FIG. 12D are cross-sectional views schematically illustrating a third unit operation of the manufacturing method of FIG. 9.

Referring to FIG. 12A, the lift-off layer 120 including fluoropolymer is formed on the substrate 100, on which the first to third anodes 101, 102, and 103 are formed.

Figure 12B:
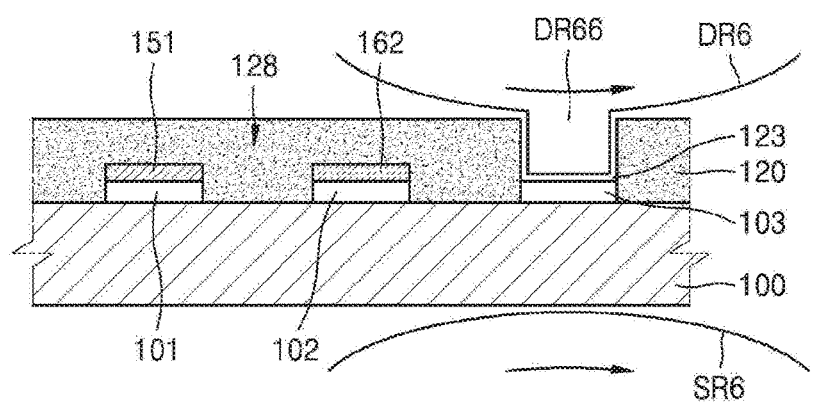

Referring to FIG. 12B, a third debossed pattern 123 is formed on the lift-off layer 120 by a roll-to-roll stamp process. In the present exemplary embodiment, the third debossed pattern 123 is formed directly on the lift-off layer 120 without forming the polymer layer 130 of FIG. 5B.

The lift-off layer 120 may include fluoropolymer having a fluorine content of about 10 to 60 wt %. The lift-off layer 120 may be formed by various polymer materials, which may generate glass transition within a temperature range provided by a drive roller DR6. The structure of FIG. 12A is interposed between the drive roller DR6 and a support roller SR6.

While the driver roller DR6 is aligned, such that a third embossed pattern DR66 of the drive roller DR6 is located at a portion of the lift-off layer 120 corresponding to the third anode 103, the drive roller DR6 is rotated to press the lift-off layer 120. The support roller SR6 is is located under the substrate 100 to support the substrate 100 while the drive roller DR6 proceeds over the lift-off layer 120.

A portion of the lift-off layer 120 reaching the glass transition temperature, due to heat transferred by the drive roller DR6, may be in a soft state. The third debossed pattern 123 is formed in a portion of the lift-off layer 120 stamped by the third embossed pattern DR66 of the drive roller DR6. An area 128 of the lift-off layer 120, where the third embossed pattern DR66 of the drive roller DR6 does not pass, remains un-patterned.

Figure 12C:
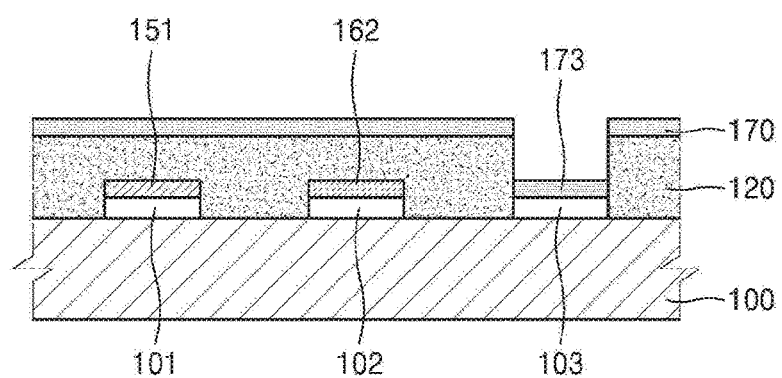

Referring to FIG. 12C, the third organic functional layer 170 including the third organic light-emitting layer is formed on the structure of FIG. 12B. In the present exemplary embodiment, the third organic light-emitting layer is used as an example of the third organic functional layer 170. Hereinafter, for descriptive convenience, the third organic functional layer and the third organic light-emitting layer may have the same reference numeral.

The portion 173 of the third organic light-emitting layer 170 is disposed on the s third anode 103, and the third organic light-emitting layer 170 is formed in the area 128 where the lift-off layer 120 remains.

Figure 12D:
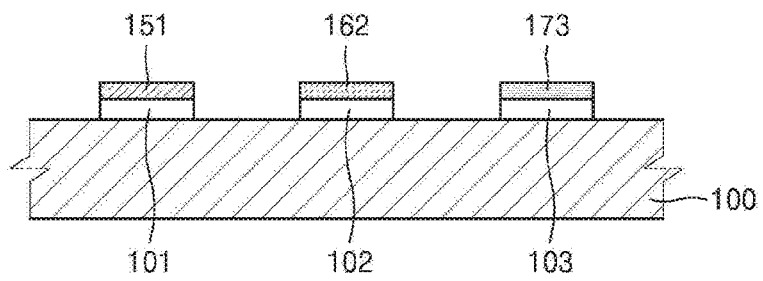

Referring to FIG. 12D, a lift-off process is performed on the structure of FIG. 12C.

As the lift-off layer 120 disposed in an area 128 is lifted off, the third organic light-emitting layer 170 disposed on the area 128, where the lift-off layer 120 remains, is removed, and, thus the third organic light-emitting layer 173 formed on the third anode 103 is left as a pattern.

Although it is not illustrated in the drawings, the above-described organic light-emitting apparatuses 1, 2, and 3 may further include an encapsulation member. The encapsulation member may include a glass substrate, a metal foil, or a thin film encapsulation layer mixed with an inorganic layer and an organic layer.

As described above, a method of manufacturing an organic light-emitting display apparatus according to the exemplary embodiments of the present invention may reduce manufacturing costs.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of manufacturing an organic light-emitting display apparatus, the method comprising:
forming an anode on a substrate;
forming a lift-off layer on the substrate comprising the anode, the lift-off layer comprising a fluoropolymer;
forming a polymer layer on the lift-off layer;
forming a pattern on a first portion of the polymer layer overlapping the anode using a roll-to-roll stamp process;
etching a first portion of the lift-off layer corresponding to the pattern using a first solvent comprising fluorine, the first portion of the lift-off layer being disposed on the anode;
forming an organic functional layer comprising a light-emitting layer on the anode and a second portion of the polymer layer not formed with the pattern;
removing the lift-off layer using a a second solvent comprising fluorine; and
forming a cathode on the organic functional layer.

2. The method of claim 1, wherein the organic functional layer comprises at least one of a hole injection layer, a hole transport layer, an electron transport layer, and an electron injection layer.

3. The method of claim 1, wherein the organic functional layer is formed by a deposition process.

4. The method of claim 1, wherein a fluorine content of the fluoropolymer is in a range of about 10 wt % to 60 wt %.

5. The method of claim 4, wherein the fluoropolymer comprises at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

6. The method of claim 1, wherein the first solvent comprises hydrofluoroether.

7. The method of claim 1, wherein the second solvent comprises hydrofluoroether.

8. The method of claim 1, wherein a glass transition temperature of the polymer layer is in a range of 50° C. to 130° C.

9. The method of claim 1, wherein etching the first portion of the lift-off layer comprises forming an undercut profile in a second portion of the lift-off layer corresponding to the second portion of the polymer layer.

10. The method of claim 1, further comprising:
forming a pixel-defining layer surrounding an edge of the anode.

11. The method of claim 1, further comprising:
forming an auxiliary cathode on the organic functional layer, before forming the cathode.

12. A method of manufacturing an organic light-emitting display apparatus, the method comprising:
forming a first anode and a second anode spaced apart from each other on a substrate;
performing a unit process on each of the first and second anodes, the unit process comprising:
forming a lift-off layer on the substrate, the lift-off layer comprising a fluoropolymer;
forming a polymer layer on the lift-off layer;
forming a pattern on a first portion of the polymer layer overlapping a corresponding anode using a roll-to-roll stamp process;
etching a first portion of the lift-off layer corresponding to the pattern using a first solvent comprising fluorine;
forming an organic functional layer comprising a light-emitting layer on the corresponding anode and on a second portion of the polymer layer not formed with the pattern; and
removing the lift-off layer using a second solvent comprising fluorine; and
forming a cathode after performing the unit process for each of the first and second anodes,
wherein a first organic light emitting layer disposed on the first anode and a second organic light emitting layer disposed on the second anode are configured to emit different colored light.

13. The method of claim 12, wherein the first organic light emitting layer and the second organic light emitting layer are configured to emit mixed light having a white color.

14. The method of claim 12, wherein the unit process further comprises forming organic light emitting layers configured to emit light having the same color.

15. The method of claim 12, wherein the cathode is integrally formed on the first and second organic light emitting layers as a common electrode.

16. The method of claim 12, wherein the unit process further comprises forming an auxiliary cathode on the organic functional layer, before forming the cathode.

* * * * *